US011538957B2

(12) United States Patent
Watabe et al.

(10) Patent No.: US 11,538,957 B2
(45) Date of Patent: Dec. 27, 2022

(54) METHODS FOR MANUFACTURING HIGH PHOTOELECTRIC CONVERSION EFFICIENCY SOLAR CELL

(71) Applicant: SHIN-ETSU CHEMICAL CO., LTD., Tokyo (JP)

(72) Inventors: Takenori Watabe, Annaka (JP); Hiroshi Hashigami, Annaka (JP); Hiroyuki Ohtsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 189 days.

(21) Appl. No.: 16/829,322

(22) Filed: Mar. 25, 2020

(65) Prior Publication Data
US 2020/0227584 A1 Jul. 16, 2020

Related U.S. Application Data

(62) Division of application No. 15/778,022, filed as application No. PCT/JP2016/004492 on Oct. 5, 2016, now abandoned.

(51) Int. Cl.
*H01L 31/18* (2006.01)
*H01L 31/05* (2014.01)
(Continued)

(52) U.S. Cl.
CPC .... *H01L 31/1864* (2013.01); *H01L 31/02167* (2013.01); *H01L 31/022425* (2013.01);
(Continued)

(58) Field of Classification Search
None
See application file for complete search history.

(56) References Cited

U.S. PATENT DOCUMENTS

2005/0189015 A1* 9/2005 Rohatgi ................ H01L 31/068
136/261
2007/0261731 A1 11/2007 Abe et al.
(Continued)

FOREIGN PATENT DOCUMENTS

CN 101167191 A 4/2008
CN 102117844 A 7/2011
(Continued)

OTHER PUBLICATIONS

Machine translation of JP 2007-294494 A. (Year: 2022).*
(Continued)

*Primary Examiner* — Eli S Mekhlin
(74) *Attorney, Agent, or Firm* — Oliff PLC

(57) ABSTRACT

The present invention provides a method for manufacturing a solar cell including: preparing a semiconductor silicon substrate which has an electrode, which is formed by baking an electrode precursor containing Ag powder on at least one main surface, has a PN junction, and is less than 100° C.; and performing an annealing treatment to the semiconductor silicon substrate at 100° C. or more and 450° C. or less. Consequently, there is provided the method for manufacturing a solar cell which suppresses a degradation phenomenon that an output of the solar cell is lowered when the solar cell is left as it stands at a room temperature in the atmosphere.

18 Claims, 6 Drawing Sheets

(51) Int. Cl.
  *H01L 31/0224* (2006.01)
  *H01L 31/0216* (2014.01)
  *H01L 31/068* (2012.01)

(52) U.S. Cl.
  CPC ........ *H01L 31/0504* (2013.01); *H01L 31/068* (2013.01); *H01L 31/1804* (2013.01); *Y02E 10/50* (2013.01); *Y02P 70/50* (2015.11)

(56) References Cited

U.S. PATENT DOCUMENTS

| | | | |
|---|---|---|---|
| 2008/0015326 A1* | 1/2008 | Kodama | C09D 183/04 528/15 |
| 2008/0075840 A1* | 3/2008 | Enjalbert | H01L 31/1868 427/74 |
| 2009/0020158 A1 | 1/2009 | Ohtsuka et al. | |
| 2011/0095240 A1* | 4/2011 | Nakamura | H01L 31/18 252/514 |
| 2011/0240997 A1 | 10/2011 | Rockenberger et al. | |
| 2013/0299753 A1 | 11/2013 | Nakayama | |
| 2014/0000685 A1 | 1/2014 | Fogel et al. | |
| 2014/0004651 A1 | 1/2014 | Fogel et al. | |
| 2014/0224323 A1 | 8/2014 | Wang et al. | |
| 2014/0242747 A1 | 8/2014 | Yaniv et al. | |
| 2015/0004740 A1* | 1/2015 | Cho | H01L 31/022425 438/65 |
| 2015/0228841 A1 | 8/2015 | Murakami et al. | |
| 2016/0329442 A1 | 11/2016 | Mitta et al. | |
| 2017/0186894 A1 | 6/2017 | Endo et al. | |

FOREIGN PATENT DOCUMENTS

| | | |
|---|---|---|
| CN | 104362216 A | 2/2015 |
| CN | 104704639 A | 6/2015 |
| CN | 105934828 A | 9/2016 |
| EP | 1691424 A2 | 8/2006 |
| EP | 3157062 A1 | 4/2017 |
| JP | 2007-95774 A | 4/2007 |
| JP | 2007-173528 A | 7/2007 |
| JP | 2007-294494 A | 11/2007 |
| JP | 2011-66044 A | 3/2011 |
| JP | 2012-209413 A | 10/2012 |
| TW | 201203320 A | 1/2012 |
| TW | 201330290 A | 7/2013 |
| WO | 2014/004426 A1 | 1/2014 |
| WO | 2015/114937 A1 | 8/2015 |
| WO | 2015/190024 A1 | 12/2015 |

OTHER PUBLICATIONS

Mar. 30, 2021 Office Action issued in Indian Patent Application No. 201847019209.
Aug. 24, 2020 Office Action issued in Indonesian Patent Application No. P00201902767.
Dec. 20, 2016 International Search Report issued in International Patent Application No. PCT/JP2016/004492.
A. A. Istratov et. al., "Interstitial copper-related center in n—type silicon" Appl. Phys. Lett., vol. 71, No. 61, pp. 2349-2351, 1997.
Jun. 6, 2017 Office Action issued in Japanese Patent Application No. 2017-519713.
Sep. 12, 2017 Office Action issued in Japanese Patent Application No. 2017-519713.
Dec. 13, 2017 Office Action issued in Taiwanese Patent Application No. 105143934.
Jan. 29, 2019 Extended European Search Report issued in European Patent Application No. 16897472.3.
Apr. 9, 2019 International Preliminary Report issued in International Patent Application No. PCT/JP2016/004492.
Dec. 31, 2021 Office Action issued in Chinese Patent Application No. 201680089834.1.
Sep. 23, 2022 Search Report issued in Chinese Patent Application No. 201680089834.1.

* cited by examiner

Prior Art

460

400

METHODS FOR MANUFACTURING HIGH PHOTOELECTRIC CONVERSION EFFICIENCY SOLAR CELL

This is a Divisional of application Ser. No. 15/778,022 filed May 22, 2018, now abandoned, which is a National Phase of International Application No. PCT/JP2016/004492 filed Oct. 5, 2016. The disclosures of the prior applications are hereby incorporated by reference herein in their entireties.

TECHNICAL FIELD

The present invention relates to a method for manufacturing a solar cell.

BACKGROUND ART

FIG. 1 shows an overview of a general high photoelectric conversion efficiency solar cell using a single-crystal N-type silicon substrate seen from a light receiving surface side. Further, FIG. 2 shows a schematic view of a cross-sectional configuration of this solar cell. This solar cell 100 has many electrodes each of which is called a finger electrode 121 and has a width of hundred or tens of micrometers as collecting electrodes on the light receiving surface on an N-type substrate 110. An interval between the finger electrodes adjacent to each other is generally approximately 1 to 3 mm. Furthermore, it also has two to four bus bar electrodes 122 as collecting electrodes to couple the solar cells. As methods for forming these electrodes (the finger electrodes 121 and the bus bar electrodes 122), there are an evaporation method, a sputtering method, and the like, but a method for printing a metal paste provided by mixing metal microparticles of Ag or the like into an organic binder with the use of a screen printing plate or the like and performing a heat treatment at hundreds of degrees to bond the paste to a substrate is widely used in terms of costs. A part of the solar cell 100 other than the electrodes is covered with an antireflection film 141 such as a silicon nitride film. A P-type diffusion layer 112 whose conductivity type is opposite to that of the substrate is formed on a front surface (the light receiving surface) of the substrate. Finger electrodes 131 are also formed on a back surface side, and a part other than the electrodes is covered with a film (a backside passivation film) 151 such as a silicon nitride film. An N-type diffusion layer 113 whose conductivity type is the same as that of the substrate is formed in the outermost layer on the back surface of the N-type substrate 110.

Moreover, as a solar cell structure with high photoelectric conversion efficiency, there is a backside contact solar cell. FIG. 3 shows a schematic view of a cross-sectional structure when an N-type substrate is used as this solar cell. In a solar cell 300, a light receiving surface of an N-type substrate 310 is covered with an antireflection film 341. N electrodes (N-type finger electrodes) 335 and a P electrode (a P-type finger electrode) 334 are alternately formed on a back surface of the solar cell 300. On the N-type substrate 310, N-type diffusion layers 313 are formed only immediately below the N electrodes 335, P-type diffusion layers 312 are formed in a large region other than these electrodes, and parts other than the electrodes are covered with a film (a backside passivation film) 351 such as a silicon nitride film. In such a solar cell 300, since no electrode is formed on the light receiving surface, incident light enters the substrate without being blocked, and hence the photoelectric conversion efficiency is increased as compared with the structure shown in FIG. 1 and FIG. 2.

CITATION LIST

Patent Literature

Patent Literature 1: Japanese Unexamined Patent Application Publication No. 2007-95774

Non-Patent Literature

Non-patent Literature 1: A. A. Istratov et al., Appl. Phys. Lett., Vol. 71, No. 16 (1997) 2349-2351

DISCLOSURE OF INVENTION

Problem to be Solved by the Invention

The solar cell having the structure has achieved the high efficiency. However, in recent years, the efficiency of the solar cell has been enhanced and, on the other hand, a conversion efficiency degrading phenomenon with time has been revealed. That is, this is a phenomenon that the conversion efficiency is lowered when the solar cell is just left as it stands at a room temperature for several days to several weeks (in the following description of the present invention, this phenomenon will be simply referred to as "degradation"). Thus, a measure to prevent the solar cell from being degraded must be taken.

In view of the problem, it is an object of the present invention to provide a method for manufacturing a solar cell which suppresses a degradation phenomenon that an output of the solar cell is lowered when the solar cell is left as it stands at a room temperature in the atmosphere.

Means For Solving Problem

To achieve the object, the present invention provides a method for manufacturing a solar cell including: preparing a semiconductor silicon substrate which has an electrode, which is formed by baking an electrode precursor on at least one main surface, has a PN junction, and is less than 100° C.; and performing an annealing treatment to the semiconductor silicon substrate at 100° C. or more and 450° C. or less.

When the low-temperature annealing treatment is performed at such a temperature to the substrate subjected to the electrode baking, it is possible to manufacture the solar cell which suppresses a degradation phenomenon that an output of the solar cell is lowered by just leaving the solar cell as it stands at a room temperature in the atmosphere.

In this case, it is preferable to perform the annealing treatment a time of 0.5 minute or more.

When the low-temperature annealing after the baking step is performed for such a time, a degradation phenomenon suppressing effect can be further assuredly provided, and the solar cell can be manufactured at lower costs.

Further, in the baking of the electrode precursor, it is preferable to set a temperature drop rate from a maximum temperature to 450° C. to 50° C./second or more.

When the baking step is performed at such a temperature drop rate, original initial characteristics of the solar cell can be enhanced. Moreover, the present invention is particularly effective when the temperature drop rate in the baking step is as large as described above.

Additionally, it is preferable to set the maximum temperature in the baking of the electrode precursor to 500° C. or more and 1100° C. or less.

When the baking step is performed at such a maximum temperature, the electrode baking can be effectively carried out.

Further, in the method for manufacturing a solar cell according to the present invention, after preparing the semiconductor silicon substrate, a low-temperature curing conductive material, which is curable at 100° C. or more and 450° C. or less, can be applied to the main surface of the semiconductor substrate in a pattern shape, and then, at the time of performing the annealing treatment, the low-temperature curing conductive material can be cured at the same time to form a conductor section.

As described above, the low-temperature annealing treatment may be carried out after applying the low-temperature curing conductive material. This is effective in case of forming a bus bar electrode by using the low-temperature curing conductive material in particular.

Furthermore, in the method for manufacturing a solar cell according to the present invention, after preparing the semiconductor silicon substrate, an insulating material, which is curable at 100° C. or more and 450° C. or less, can be applied to the main surface of the semiconductor silicon substrate in a pattern shape, and then, at the time of performing the annealing treatment, the insulating material can be cured at the same time to form an insulator film.

As described above, the low-temperature annealing treatment may be performed after applying the insulating material in the pattern shape. This is effective in case of manufacturing the backside electrode solar cell in particular.

Moreover, in the method for manufacturing a solar cell according to the present invention, the semiconductor silicon substrate is preferably an N-type semiconductor silicon substrate.

The method for manufacturing a solar cell according to the present invention is more effective to the N type than to the P type.

Additionally, the present invention provides a solar cell including a semiconductor silicon substrate which has an electrode formed by baking an electrode precursor on at least one main surface, has a PN junction, and is less than 100° C., the semiconductor silicon substrate being subjected to an annealing treatment at 100° C. or more and 450° C. or less.

Further, the present invention provides the solar cell characterized in that a value A of an initial short-circuit current measured within one day after the annealing treatment and a value B of a short-circuit current measured after storing the solar cell at a room temperature for one week from the measurement of the initial short-circuit current meet a relationship of B/A≥0.98.

Furthermore, the present invention provides a solar cell including a semiconductor silicon substrate having a PN junction, and an electrode formed by baking an electrode precursor on at least one main surface of the semiconductor silicon substrate, the solar cell being characterized in that a value A of an initial short-circuit current measured within one day after completion of the solar cell and a value B of a short-circuit current measured after storing the solar cell at a room temperature for one week from the measurement of the initial short-circuit meet a relationship of B/A≥0.98.

The solar cell according to the present invention is a solar cell which suppresses a degradation phenomenon that an output of the solar cell is lowered by just leaving the solar cell as it stands at a room temperature in the atmosphere.

Moreover, the present invention provides a photovoltaic module having the built-in solar cell.

As described above, the solar cell according to the present invention can be included in a photovoltaic module in a built-in manner.

Additionally, the present invention provides a photovoltaic power generation system including the photovoltaic module.

As described above, the photovoltaic module having the built-in solar cell according to the present invention can be used in the photovoltaic power generation system.

Further, the present invention provides a solar cell manufacturing apparatus including: a baking furnace in which a semiconductor silicon substrate having an electrode precursor formed on at least one main surface is heated, and then the electrode precursor is baked to form an electrode on the semiconductor silicon substrate by decreasing a temperature to be less than 100° C.; and an annealing furnace in which the semiconductor silicon substrate treated with the use of the baking furnace is annealed at 100° C. or more and 450° C. or less.

When the solar cell is manufactured by using such a solar cell manufacturing apparatus, it is possible to manufacture the solar cell which suppresses a phenomenon that an output of the solar cell is lowered by just leaving the solar cell as it stands at a room temperature in the atmosphere.

At this time, the baking furnace is mechanically connected to the annealing furnace, and the semiconductor silicon substrate carried out of the baking furnace can be automatically accommodated in the annealing furnace.

When the solar cell is manufactured by using such a solar cell manufacturing apparatus, it is possible to automatically manufacture the solar cell which suppresses the degradation phenomenon.

Effect of the Invention

According to the method for manufacturing a solar cell of the present invention, it is possible to manufacture the high photoelectric conversion efficiency solar cell which suppresses the degradation phenomenon that an output of the solar cell is lowered when the solar cell is left as it stands at a room temperature in the atmosphere.

BEST MODE(S) FOR CARRYING OUT THE INVENTION

As described above, in recent years, the efficiency of the solar cell has been enhanced and, on the other hand, a conversion efficiency degrading phenomenon with time has been revealed. That is, there is a problem of a degradation phenomenon that the conversion efficiency is lowered when the solar cell is just left as it stands at a room temperature for several days to several weeks. The present inventors have earnestly conducted examinations about a measure to prevent such a degradation phenomenon from occurring, and brought the present invention to completion.

Although an embodiment according to the present invention will now be descried hereinafter, the present invention is not restricted thereto.

In a method for manufacturing a solar cell according to the present invention, first, a semiconductor silicon substrate which has an electrode formed by baking an electrode precursor on at least one main surface, also has a PN junction, and is less than 100° C. is prepared as described below (a step a). This semiconductor silicon substrate can be prepared through the following sub-steps a-1 to a-4. First, a substrate made of semiconductor silicon is prepared (a sub-step a-1). Then, the PN junction is formed on the substrate made of the semiconductor silicon (a sub-step a-2). Subsequently, the electrode precursor is formed on at least one main surface of the substrate (a sub-step a-3). As the electrode precursor, a silver paste or the like can be used. Following the sub-step a-3, the substrate having the electrode precursor formed thereon is heated, and then a temperature is lowered to be less than 100° C. (at this time, cooling may be effected until the temperature reaches a value substantially equal to an environmental temperature in a surrounding area), thereby baking the electrode to form the electrode on the substrate (a sub-step a-4. This formation of the electrode effected by baking the electrode precursor will be also referred to as an electrode baking step hereinafter). The method for manufacturing a solar cell according to the present invention can appropriately have any other steps.

Figure 1:
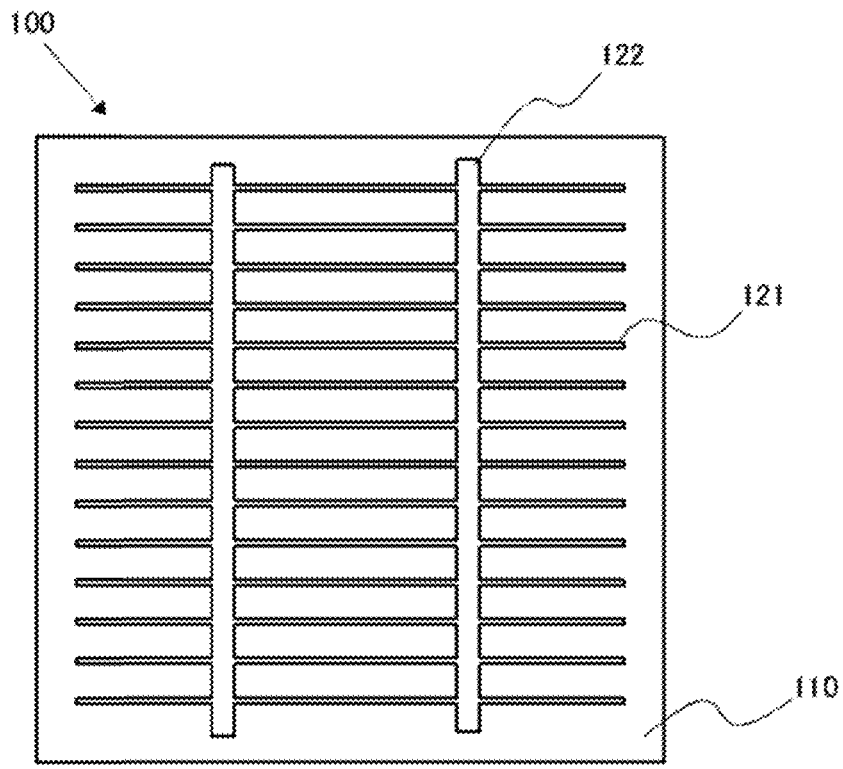
FIG. 1 is an overview diagram showing a general solar cell to which the present invention can be applied from a light receiving surface side.
Figure 2:
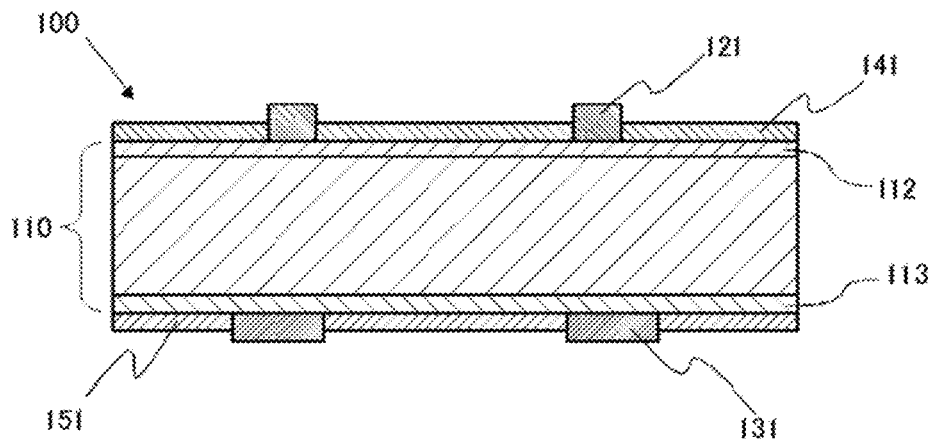
FIG. 2 is a schematic cross-sectional view of the general solar cell to which the present invention can be applied.

The method for manufacturing a solar cell according to the present invention has performing an annealing treatment at 100° C. or more and 450° C. or less to the semiconductor silicon substrate prepared at the step a as described above (a step b). When a low-temperature annealing step of annealing the substrate at a relatively low temperature is provided after the electrode baking step in this manner, degradation can be recovered, and performing this treatment enables avoiding aging degradation. That is, the method for manufacturing a solar cell according to the present invention can make it possible to manufacture a solar cell with high photoelectric conversion efficiency which suppresses a degradation phenomenon that an output of the solar cell is lowered when the solar cell is left as it stands at a room temperature in the atmosphere. Although such a method for manufacturing a solar cell enables manufacturing the solar cell having a configuration illustrated in FIGS. 1 and 2, the method can be likewise applied to solar cells having other configurations.

A temperature at which the annealing treatment is performed is set to 100° C. or more and 450° C. or less as described above. When the temperature is lower than 100° C., annealing effect does not appear. When the temperature is higher than 450° C., A solar cell main body may have a flaw, e.g., an increase in contact resistance of the electrode. As a temperature for this low-temperature annealing treatment, a temperature which is 150° C. or more and 400° C. or less is preferable, and a temperature which is 200° C. or more and 300° C. or less is more preferable.

It is preferable to perform the annealing treatment for a time which is 0.5 minute or more. When the time of the low-temperature annealing treatment is set to 0.5 minute or more, the degradation phenomenon suppressing effect can be more assuredly provided. Setting the time of the low-temperature annealing treatment to one minute or more is preferable, and setting the same to five minutes or more is more preferable. Further, even when the time of the low-temperature annealing treatment is too long, no quality problem occurs, but setting the time to 180 minutes or less is preferable to suppress a manufacturing cost, and setting the same to 60 minutes or less is more preferable.

The low-temperature annealing treatment may be carried out in a plurality of stages. That is, the low-temperature annealing treatment can be once performed at a temperature of 100° C. or more and 450° C. or less, the temperature can be decreased to near a room temperature, and the low-temperature annealing treatment can be again performed at a temperature of 100° C. or more and 450° C. or less. In this case, it is preferable to set a total time of the low-temperature annealing treatment to 0.5 minute or more and 60 minutes or less.

In the baking of the electrode precursor (a sub-step a-4, a baking step), it is preferable for a temperature drop rate from a maximum temperature to 450° C. to be 50° C./second or more. When the temperature drop rate is high in this manner, original initial characteristics of the solar cell can be enhanced. Further, when the temperature drop rate is higher, the effect of the present invention can be further greatly exerted, and hence it is preferable to set the temperature drop rate to 50° C./second or more as described above.

In the manufactured solar cell, to obtain a high initial output, in the baking of the electrode precursor, a precipitous drop in temperature is requisite. However, the precipitous drop in temperature also relates to aging degradation of the solar cell. Thus, it was difficult to achieve both a high initial output of the solar cell and avoidance of the aging degradation. Even if the temperature drop in the baking of the electrode precursor is precipitous, the method for manufacturing a solar cell according to the present invention can avoid the aging degradation after manufacture of the solar cell.

Furthermore, it is preferable to set the maximum temperature in the baking of the electrode precursor (the sub-step a-4, the baking step) to 500° C. or more and 1100° C. or less. The annealing effect can be readily provided when the maximum temperature is 500° C. or more, and contamination from a baking furnace can be suppressed when the maximum temperature is 1100° C. or less, whereby the annealing effect can be easily provided. To obtain the greater solar cell initial characteristics, it is preferable to set the maximum temperature of the baking to 550° C. or more and 1000° C. or less since a low contact resistance between the electrode and the substrate can be realized. Moreover, the baking of the electrode can advance when the maximum temperature of the baking is set to 700° C. or more, or a reduction in bulk lifetime does not occur when the same is set to 850° C. or less, and hence the greater solar cell initial characteristics can be provided, which is preferable.

Figure 12:
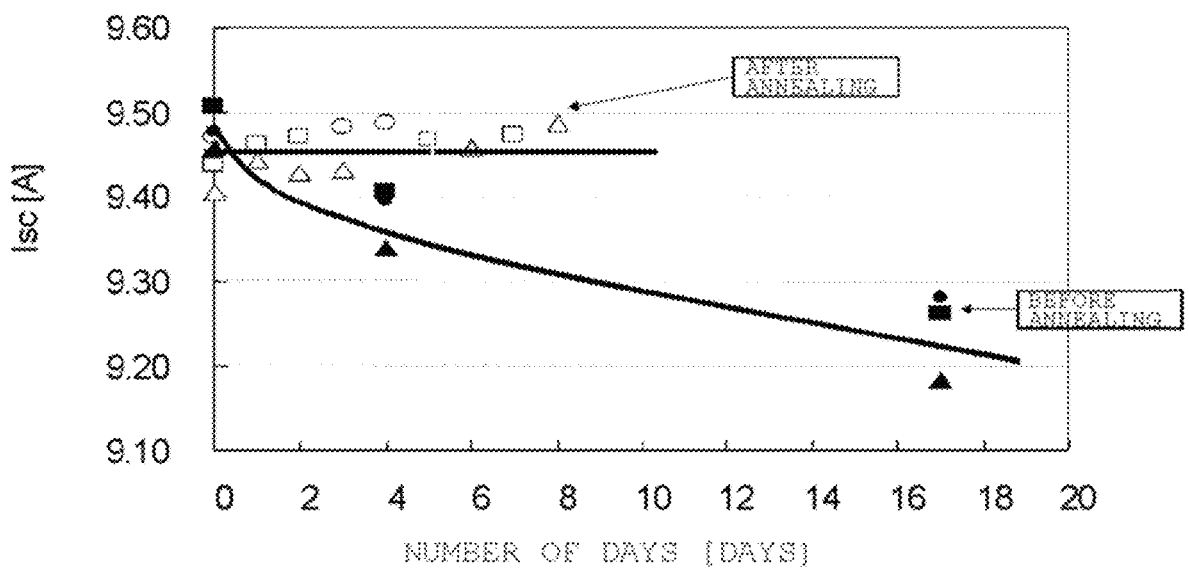
FIG. 12 is a view showing an aging degradation phenomenon and recovery by annealing according to the present invention.

FIG. 12 is a view showing aging data of a short-circuit current ($I_{sc}$) of the solar cell created through the electrode baking step. Symbols ●, ■, ▲ and represent different substrates, and changes in short-circuit current with time are shown with a moment immediately after the baking being determined as 0. It can be understood that the changes are decreased with the passage of days. Symbols ○, □, Δ and A represent changes in short-circuit current with time when the substrates after the passage of 17 days are annealed and a moment immediately after the annealing is determined as 0. The short-circuit current is restored to a value immediately after the baking, and no aging degradation is observed. The above is a specific example of aging degradation, recovery of the degradation due to the low-temperature annealing, and inhibition of the degradation phenomenon.

Although mechanisms of the aging degradation of the solar cell, the recovery of the degradation due to the low-temperature annealing, and the inhibition of the degradation phenomenon are not necessarily clear, but they can be understood as follows.

In a general solar cell manufacturing process, it is often the case that a last high-temperature heat treatment step is an electrode forming step. The electrode forming step is specifically printing and baking a paste containing silver powder or the like, and especially the baking step includes lowering a high temperature close to 800° C. to a room temperature or a close temperature in less than 1 minute. When Cu (copper) is present, it is considered that Cu disperses in the substrate in the form of atoms due to this precipitous drop in temperature, and it is also considered that Cu is harmless to the solar cell characteristics at this time.

Here, in Non-patent Literature 1, Cu in silicon bulk forms precipitates in the bulk in several hours order even at a room temperature, and it can be considered that the precipitates lower the characteristics of the solar cell. That is, this is considered to be a factor of a reduction in output with time.

Moreover, as described in Patent Literature 1, it is widely known that Cu in silicon bulk disperses in a substrate surface when a heat treatment at a room temperature to 400° C. is performed more than once. It is considered that, when such a low-temperature annealing treatment is performed, Cu in the bulk moves to and fixed in the substrate surface and turns to be harmless to the solar cell characteristics. That is, this is considered to be a factor which recovers the degradation due to the low-temperature annealing and inhibits the degradation.

In a known example, a mode of Cu in a silicon substrate is not described in detail, and the solar cell has a special step, i.e., the baking of the electrode (the precipitous drop in temperature), and hence it is considered that the degradation phenomenon occurs.

On the other hand, although analyses of elements in a solar cell substrate degraded with time were carried out based on a total dissolution ICP-MS (inductively coupled plasma mass spectrometry) method, Cu was below a detection lower limit ($1.9 \times 10^{12}$/cm$^3$) in all of the plurality of analyses. An analysis with higher sensitivity cannot be conducted in the current technology, and the degradation mechanism due to Cu cannot be denied or determined. As shown in FIG. 12, since the degradation phenomenon is suppressed in the solar cell subjected to the low-temperature annealing treatment based on the method according to the present invention, a structure of the solar cell itself must have changed as compared with a solar cell which has not been subjected to the low-temperature annealing treatment, but this structure cannot be identified by at least the current technology.

Additionally, the inventors have also examined possibilities other than Cu. However, potential substances are considerably restricted when a situation where the degradation occurs at the room temperature is considered, and a mechanism has not been proposed.

Although the detailed mechanism is not necessarily clear as described above, the method for manufacturing a solar cell including features of the present invention can suppress the degradation phenomenon which occurs in conventional solar cells at any rate.

The low-temperature annealing step can also serve as any other low-temperature heat treatment in the solar cell manufacturing process, and these steps can be performed at the same time. For example, a low-temperature curing conductive material is applied in a pattern shape, and then the low-temperature annealing treatment for suppressing the solar cell degradation can be carried out. This method is effective when a bus bar electrode is made of a low-temperature curing conductive material. More specifically, the following steps can be taken. That is, after the step (the step a) of preparing the semiconductor silicon substrate by performing the electrode baking or the like, a low-temperature curing conductive material which can be cured at 100° C. or more and 450° C. or less is applied in a pattern shape to a main surface of the substrate. Then, at the time of performing the annealing treatment (the step b), curing of the low-temperature curing conductive material can be simultaneously carried out, thereby forming a conductor section. This conductor section can be constituted as, e.g., a bus bar electrode. When the low-temperature annealing treatment according to the present invention is performed simultaneously with the heat treatment required for formation of the bus bar electrode, the number of steps is not increased. Thus, the low-temperature annealing treatment according to the present invention can be performed at a low cost.

Further, the low-temperature annealing treatment for suppression of the solar cell degradation can be carried out after applying the insulating material in the pattern shape. This is effective in manufacture of a backside contact solar cell in particular. More specifically, the following steps can be taken. That is, after preparing the semiconductor silicon substrate by performing the electrode baking or the like (the step a), the insulating material which can be cured at 100° C. or more and 450° C. or less is applied in the pattern shape to the main surface of the substrate. Then, at the time of performing the annealing treatment (the step b), the insulating material can be cured at the same time to form an insulator film. This insulator film can be constituted as, e.g., a film which separates a P electrode and an N electrode of the backside contact solar cell.

It is preferable to perform the annealing step at a stage of the substrate rather than after manufacture of a later-described solar cell modular or string, as described above. A constituent material of the module or the string contains solder or a sealing material. When such a material is exposed to high temperatures, its quality is decreased, thus preventing execution of the annealing. Furthermore, an area of an individual unit increases, and hence not only a size of an apparatus enlarges, but also uniformly performing heating (annealing) becomes technically difficult.

In the following detailed description, to understand the overall invention and show how the invention is carried out in a given specific example, many given details will be explained. However, it can be understood that the present invention can be carried out without these given details. To avoid obscureness of the present invention, a well-known method, a procedure, and technologies will not be described in detailed hereinafter. Although a given specific example of the present invention will be described with reference to given drawings, the present invention is not restricted thereto. The drawings described herein are schematic, and do not restrict the scope of the present invention. Further, in the drawings, for the purpose of illustration, sizes of several elements are exaggerated, and hence a scale may not be correct.

The method for manufacturing a high photoelectric conversion efficiency solar cell according to the present invention will now be more specifically described hereinafter while taking use of an N-type substrate as an example. It is preferable for the substrate to be an N-type semiconductor silicon substrate. That is because the present invention exerts a larger effect to the N type than to the P type. Although the details of this reason is unclear, it is known that Cu in the P-type substrate starts moving to a surface at a temperature which is close to a room temperature, and it can be considered that the degradation phenomenon itself is relatively hard to occur as compared with the N-type substrate. However, the present invention can be also uneventfully applied to the P-type substrate.

First, high-purity silicon is doped with a group V element such as phosphorous, arsenic or antimony, and an as-cut single crystal {100} N-type silicon substrate having a specific resistance of 0.1 to 5 $\Omega \cdot cm$ is prepared. In case of using a single crystal as a silicon substrate, the single-crystal silicon substrate may be fabricated by any method, i.e., a CZ (Czochralski) method or a FZ (floating zone) method. Further, the silicon substrate prepared here does not necessarily have to be made of the single-crystal silicon, and polycrystal silicon may be used.

Then, mechanical damage on the substrate surface formed at the time of slicing or cutting is subjected to etching using, e.g., a high-concentration alkali such as a sodium hydroxide aqueous solution or a potassium hydroxide aqueous solution having concentration of 5 to 60% or a mixed acid of a hydrofluoric acid and a nitric acid. Depending on conditions for texture formation as a subsequent step, this mechanical damage removal step is not necessarily required, and it can be omitted.

Subsequently, small irregularities called a texture are formed on a substrate surface. The texture is an effective method to reduce a reflectance of the solar cell. The texture is fabricated by immersion in a heated solution (concentration: 1 to 10%, temperature: 60 to 100° C.) of alkali such as sodium hydroxide, potassium carbonate, sodium carbonate, or sodium hydrogencarbonate for approximately 10 minutes to 30 minutes. A certain amount of 2-propanol is often dissolved in the solution to promote a reaction.

After forming the texture, cleaning is performed in an acid aqueous solution of, e.g., a hydrochloride acid, a sulfuric acid, a nitric acid, a hydrofluoric acid or a mixture of these members. Hydrogen peroxide can be mixed to improve cleanliness.

Subsequently, a P-type diffusion layer is formed on the substrate. For formation of the diffusion layer, there are a vapor phase diffusion method and a coating diffusion method, and any one of these methods can be used. As an example of the vapor phase diffusion method, it is possible to adopt a method for overlapping two substrates as a pair and putting them in a heat treatment furnace in this state, leading a mixed gas of $BBr_3$ and oxygen, and performing a heat treatment at 950 to 1050° C. As a carrier gas, nitrogen or argon is preferable. As an example of the coating diffusion method, it is possible to adopt a method for applying a coating agent containing a boron source to one entire main surface of the substrate and performing a heat treatment at 950 to 1050° C. As the coating agent, it is possible to use an aqueous solution containing 1 to 4% of boric acid as the boron source and 0.1 to 4% of polyvinyl alcohol as a thickener.

Then, an N-type diffusion layer is formed. For formation of the diffusion layer, there are the vapor phase diffusion method and the coating diffusion method, and any one of these methods can be used. As an example of the vapor phase diffusion method, it is possible to adopt a method for overlapping two substrates as a pair and putting them in a heat treatment furnace in this state and performing a heat treatment at 850 to 950° C. in a mixed gas atmosphere of phosphorous oxychloride, nitrogen, and oxygen. The coating diffusion method is a method for spin-coating or printing a material containing phosphorous and then carrying out a treatment method, and any method can be used.

Then, glass on the surface is removed with the use of the hydrofluoric acid or the like.

Then, an antireflection film is formed on a light receiving surface. As the antireflection film, a silicon nitride film, a silicon oxide film, or the like can be used. In case of the silicon nitride film, a plasma CVD apparatus is used to form the film with a film thickness of approximately 100 nm. As a reactant gas, monosilane ($SiH_4$) and ammonia ($NH_3$) are often mixed and used, but nitrogen can be likewise used in place of $NH_3$. Hydrogen is mixed in the reactant gas in some cases to adjust a process pressure and dilute the reactant gas. In case of the silicon oxide film, the CVD method may be used, but higher cell characteristics can be provided in a film formed by a thermal oxidation method.

It is desirable to likewise form a protective film which is the silicon nitride film or the silicon oxide film on a back surface like the light receiving surface. To enhance a protection effect on the surface, a thin aluminum oxide film or thermal oxide film of approximately 1 to 20 nm may be formed on the substrate surface in advance, and the silicon nitride film or the silicon oxide film may be formed.

Subsequently, as a backside electrode, for example, a paste containing Ag powder is formed by a screen printing method. A printing pattern is a comb-tooth shape, and it is easiest to form a finger electrode and a bus bar electrode at the same time. It is preferable for a finger electrode width to be approximately 40 to 200 μm and for a bus bar electrode width to be approximately 0.5 to 2 mm.

The screen printing method is also used for formation of light receiving surface electrodes, and an Ag paste provided by mixing the Ag powder and glass frit with an organic binder is printed. A printing pattern is the comb-tooth shape like the back surface, and it is easiest to form the finger electrode and the bus bar electrode at the same time. It is preferable for a finger electrode width to be approximately 40 to 100 μm and for a bus bar electrode width to be approximately 0.5 to 2 mm.

After the electrode printing on the front and back surfaces, the Ag powder is penetrated through (fire-through) the silicon nitride film by a heat treatment so that the electrodes can be conducive with silicon. Baking of the electrodes on the back surface and that of the electrodes on the light receiving surface can be performed at a time, or they may be separately performed. The baking is usually carried out by performing a treatment at a temperature of 700 to 850° C. for several seconds to several minutes. To provide the higher conversion efficiency, a temperature drop rate is also an important factor, and this rate is desirably higher than 50° C./second. It is to be noted that, in the description of the present invention, the temperature drop rate of the baking step means an average value until 450° C. is reached from a peak temperature in the baking step.

At last, the substrate after the electrode baking is heated (annealed) at 100 to 450° C. for 1 to 60 minutes. As an annealing method, there are indirect resistance heating, direct resistance heating, infrared heating, high-frequency induction heating, and the like. The indirect resistance heating is a system for conducting heat from a heated heating element to an element to be heated to effect heating, the direct resistance heating is a system for directly flowing a current to an object to be heated to effect heating, the infrared heating is a system for directly applying electrical energy to a heating material in the form of infrared rays to effect heating, and the high-frequency induction method is a system for converting the electrical energy into high-frequency waves and directly applying them to a heating material to effect heating. Although any system may be used to perform heating, the indirect resistance heating will be described herein. A heating apparatus may be a batch type clean oven, a heating furnace, a simple oven with a heating space, or a hot plate whose device surface is heated, and any one of a single-wafer processing walking beam system and a belt conveyer system may be used. In case of batch processing, cells (substrates) may be directly overlapped and then treated, or the cells may be accommodated in a container and then treated. In case of directly overlapping the cells and then treating them, the number of cells to be treated is preferably one to 400. When the number of cells to be treated is 400 or less, easy handling can be realized, which is preferable. Although the number of cells to be treated is determined based on a thermal capacity of each cell and a capability of a heat source, a preferred number is generally 1000 or less.

The present invention also provides a solar cell manufacturing apparatus which is suitable for manufacture of the solar cell. This solar cell manufacturing apparatus includes a baking furnace in which an electrode precursor is baked to form an electrode on a semiconductor silicon substrate by decreasing a temperature to be less than 100° C. after heating a semiconductor silicon substrate having the electrode precursor formed on at least one main surface. Further, it also includes an annealing furnace in which the semiconductor silicon substrate treated in the baking furnace is annealed at 100° C. or more and 450° C. or less.

Although the substrate may be moved from the baking furnace to the annealing furnace by human power as a matter of course, the baking furnace may be mechanically connected to the annealing furnace to automatically move the substrate. That is, in the solar cell manufacturing apparatus, the baking furnace can be mechanically connected to the annealing furnace so that the semiconductor silicon substrate carried out from the baking furnace can be automatically accommodated in the annealing furnace. For example, the baking furnace adopting the walking beam system or the belt conveyer system and the annealing furnace likewise adopting the walking beam system or the belt conveyer system can be used by synchronizing substrate carrying operations.

Furthermore, when a substrate transfer machine is appropriately provided between the baking furnace and the annealing furnace, the baked substrate can be temporarily accommodated in a heat-resisting container, or the substrates can be directly overlapped and accommodated in a batch type furnace. In both the manual and automatic methods, to stabilize handling of the substrate, a substrate temperature must be set to be less than 100° C.

Although the example where the finger electrode and the bus bar electrode are simultaneously formed has been described above, the finger electrode and the bus bar electrode can be separately formed. Since a contact resistance between the bus bar electrode and the substrate does not have to be lowered, a low-temperature curing conductive paste can be used as a material of the bus bar electrode. Specifically, it is possible to use one or more conductive materials selected from Ag, Cu, Au, Al, Zn, In, Sn, Bi, and Pb and a material containing one or more resins selected from an epoxy resin, an acrylic resin, a polyester resin, a phenol resin, and silicone resin. The Ag paste is applied by printing, a dispenser, or the like to form (bake) the finger electrode having the parallel line shape by the fire-through method, and then a bus bar electrode precursor is applied and dried with the use of the paste by printing, the dispenser, or the like so as to be orthogonal to the finger electrode. To stably form the bus bar electrode precursor, a substrate temperature at the time of forming the bus bar electrode precursor must be set to be less than 100° C. When this electrode precursor is heated at 100° C. or more and 450° C. or less, not only the bus bar electrode can be formed, but also an effect to avoid degradation can be provided. Although the processing method in this case may be the batch type, when the single-wafer processing system, e.g., the walking beam system or the belt conveyer system is used, the processing can be smoothed. At this time, it is preferable to perform the low-temperature annealing to suppress degradation of the solar cell for 0.5 minute or more and 60 minutes or less but, in case of curing a low-temperature curing conductive material at the same time, setting this annealing time to one minute or more is more preferable, and setting the same to five minutes or more is particularly preferable. That is because curing of the low-temperature curing conductive material can be easily performed. Moreover, a temperature of the low-temperature annealing can be further optimized at 100° C. or more and 450° C. or less which is a temperature range enabling suppression of the solar cell degradation in accordance with, e.g., a type of the low-temperature curing conductive material.

Figure 3:
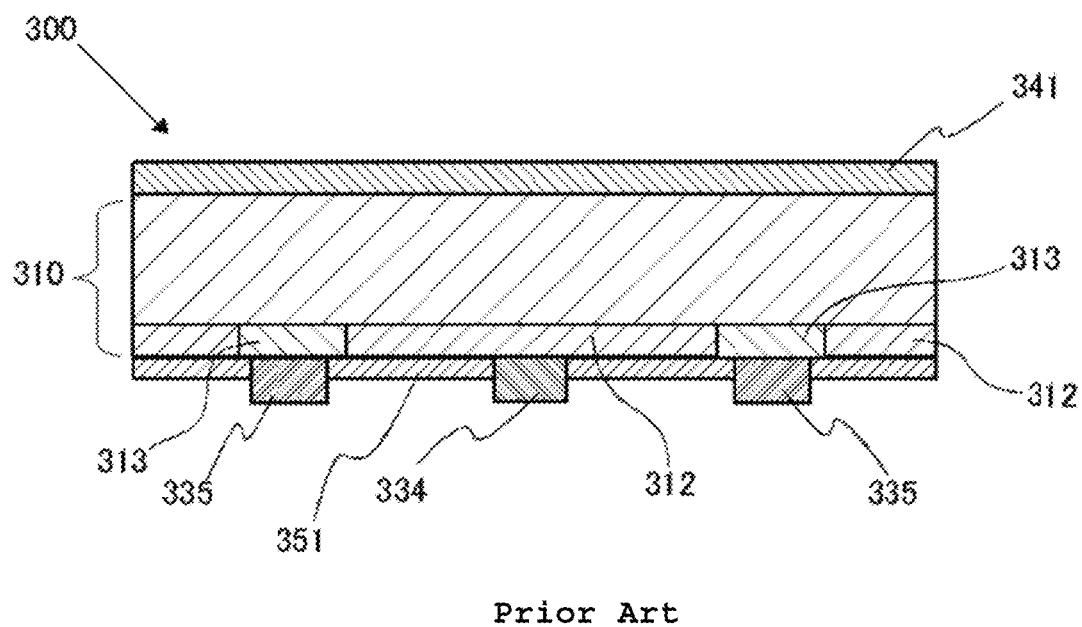
FIG. 3 is a schematic cross-sectional view of a general backside contact solar cell to which the present invention can be applied.

Additionally, an example where the present invention is applied to such a method for manufacturing a backside contact solar cell as illustrated in FIG. 3 will be also described hereinafter.

A P-type diffusion layer is formed on an entire substrate back surface of a substrate subject to the texture formation as described above.

Then, the substrate is thermally oxidized, or a silicon nitride film or a silicon oxide film is formed on both surfaces of the substrate. These films function as a diffusion mask at the time of subsequent phosphorous diffusion.

Subsequently, the mask formed on the back surface is opened in a pattern shape. As the pattern, a parallel line shape having substantially equal intervals is simplest. As a method, the opening may be physically performed by using a laser, a dicer, or the like, or it may be chemically performed by taking advantage of an etching paste, a photoresist, or the like. After the opening, immersion into a KOH or NaOH aqueous solution is carried out to etch a $P^+$ layer in the opening portion.

Then, phosphorous diffusion is carried out by the method to form an $N^+$ layer in the opening portion alone. This is immersed into HF or the like to remove the mask and glass formed at the time of diffusion.

Then, the substrate is cleaned, and both the surfaces are passivated by using an aluminum oxide film, a silicon nitride film, or the like.

An electrode paste is printed on both the P and N diffusion layers. A pattern at this time may be parallel to the pattern of each diffusion layer. That is, it is easiest to adopt a parallel line shape in which the respective P and N electrodes are alternately arranged. This substrate is baked and subjected to fire-through. Conditions are the same as those described above.

Then, bus bar electrodes are formed. Since a P bus bar electrode must be electrically connected to a P finger electrode alone and an N bus bar electrode must be electrically connected to an N finger electrode alone, an insulating material is printed in a pattern shape before forming the bus bar electrodes. That is, the insulating material is printed at least at each intersecting portion of the P bus bar electrode and the N finger electrode and each intersecting portion of the N bus bar electrode and the P finger electrode. As the insulating material, a material containing one or more resins selected from a silicone resin, a polyimide resin, a polyamide-imide resin, a fluorine resin, a phenol resin, a melamine resin, an urea resin, polyurethane, an epoxy resin, an acrylic resin, a polyester resin, and a poval resin is preferable. To stably make the insulating material, a substrate temperature at the time of applying the insulating material must be set to be less than 100° C. After the pattern formation, the substrate is heated (low-temperature annealing) at 100 to 450° C. Consequently, not only an insulator layer is formed, but an effect to avoid degradation can be also provided. A low-temperature annealing time may be set to 0.5 to 60 minutes, but it may be adjusted depending on a type of the insulator material or the like. For example, the low-temperature annealing time may be set to one minute or more and 100 minutes or less. Further, the low-temperature annealing temperature can be further optimized at 100° C. or more and 450° C. or less which is a temperature range that enables suppressing the solar cell degradation depending on, e.g., a type of the insulator material.

At last, when each bus bar electrode is formed by using, e.g., the material, a high photoelectric conversion efficiency backside contact solar cell which suppresses degradation can be fabricated.

Although the example of the N-type substrate has been described above, the P-type substrate can be embodied by just counterchanging the P type and the N type in the above description.

The solar cell manufactured by the method is the solar cell which is provided by performing the anneal treatment at 100° C. or more and 450° C. or less to the semiconductor silicon substrate which has the electrode formed by baking the electrode precursor on at least one main surface, has the PN junction, and is less than 100° C. Such a solar cell according to the present invention is the solar cell which suppresses the degradation phenomenon that an output of the solar cell is lowered when the solar cell is left as it stands at a room temperature in the atmosphere. The solar cell according to the present invention can be a solar cell in which a value A of an initial short-circuit current measured within one day from the annealing treatment and a value B of a short-circuit current measured after storing the solar cell at a room temperature for one week from the measurement of the initial short-circuit current meet a relationship of $B/A \geq 0.98$ (see FIG. 12).

The solar cell according to the present invention can have the following configuration and characteristics. That is, this solar cell includes the semiconductor silicon substrate having the PN junction. Furthermore, it also has an electrode formed by baking the electrode precursor on at least one main surface of the semiconductor silicon substrate. Moreover, the value A of the initial short-circuit current measured within one day after completion of this solar cell and the value B of the short-circuit current measured after storing the solar cell at the room temperature for one week from the measurement of the initial short-circuit current meet the relationship of $B/A \geq 0.98$. Such a solar cell according to the present invention is the solar cell which suppresses the degradation phenomenon that an output of the solar cell is lowered when the solar cell is left as it stands at a room temperature in the atmosphere.

Figure 8:
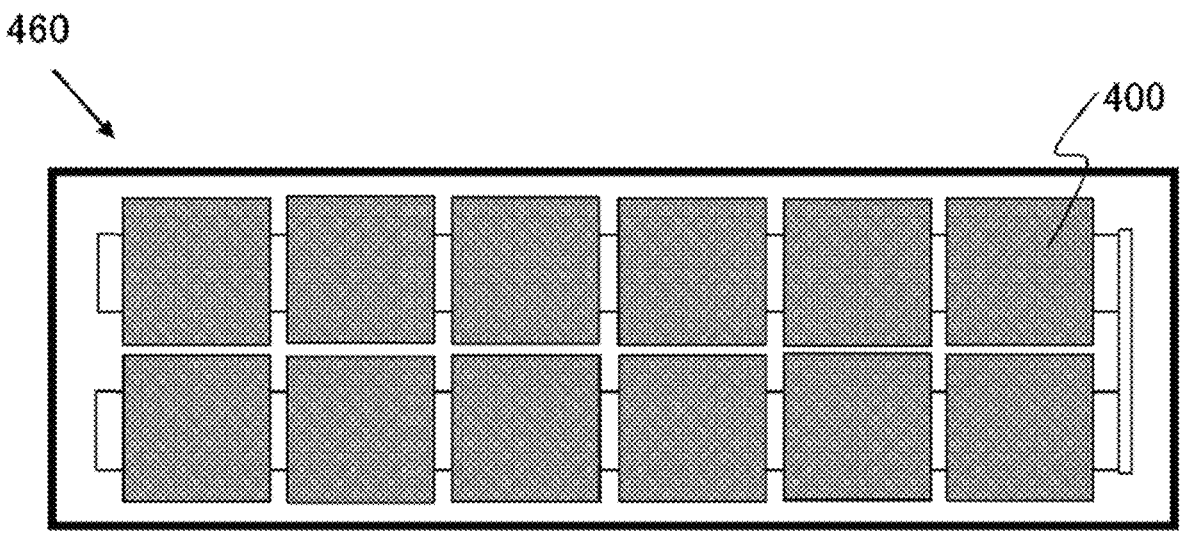
FIG. 8 is an overview diagram of a photovoltaic module according to the present invention.

The solar cell manufactured by the method can be used in manufacture of a photovoltaic module. FIG. 8 shows an overview of an example of the photovoltaic module having the built-in solar cell manufactured by the method. FIG. 8 shows an example of the photovoltaic module having a built-in backside contact high photoelectric conversion efficiency solar cell, but the solar cell manufactured by the method for manufacturing a solar cell according to the present invention can be used in the photovoltaic module without being restricted to this example. The solar cells 400 are configured in such a manner that they are laid like tiles within a photovoltaic module 460.

Figure 9:
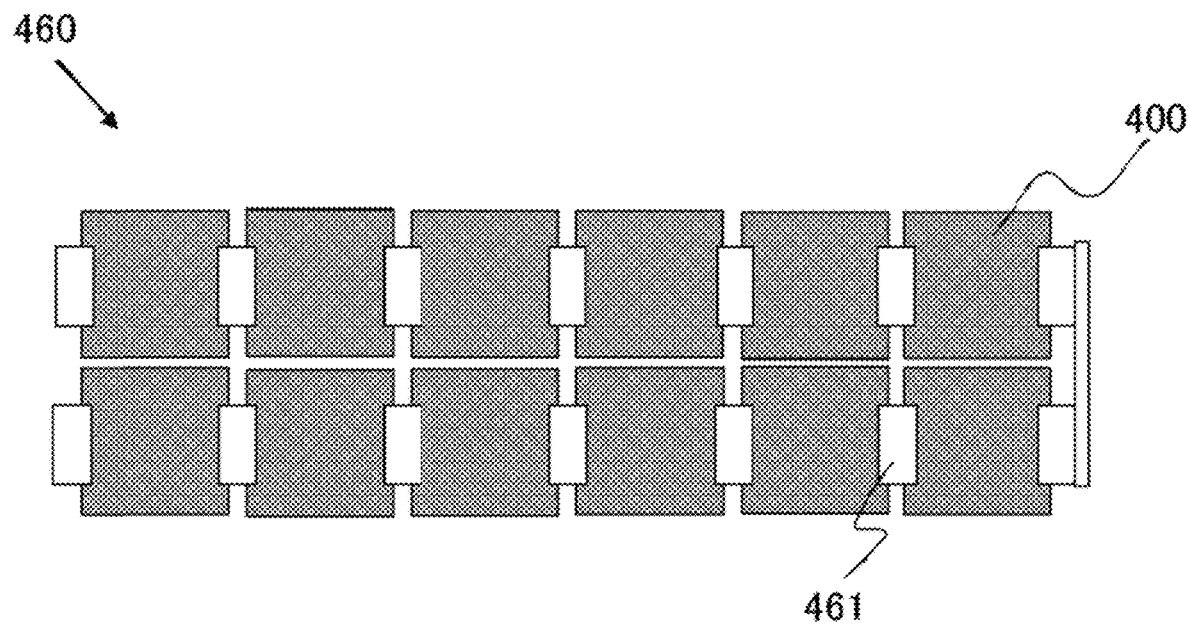
FIG. 9 is a schematic view of an inside of a back surface of a photovoltaic module according to the present invention.

In the photovoltaic module 460, several to tens of solar cells 400 adjacent to each other are electrically connected in series and constitute a series circuit called a string. FIG. 9 shows an overview of the string. FIG. 9 corresponds to a schematic view of a back surface side in the module which cannot be usually seen. Further, a finger electrode or a bus bar electrode is not shown. To achieve the series connection, as shown in FIG. 9, a P bus bar (a bus bar electrode connected to the finger electrode joined to a P-type layer of a substrate) and an N bus bar (a bus bar electrode connected to the finger electrode joined to an N-type layer of the substrate) of the adjoining solar cells 400 are connected to each other through a tab lead wire 461 or the like.

Figure 10:
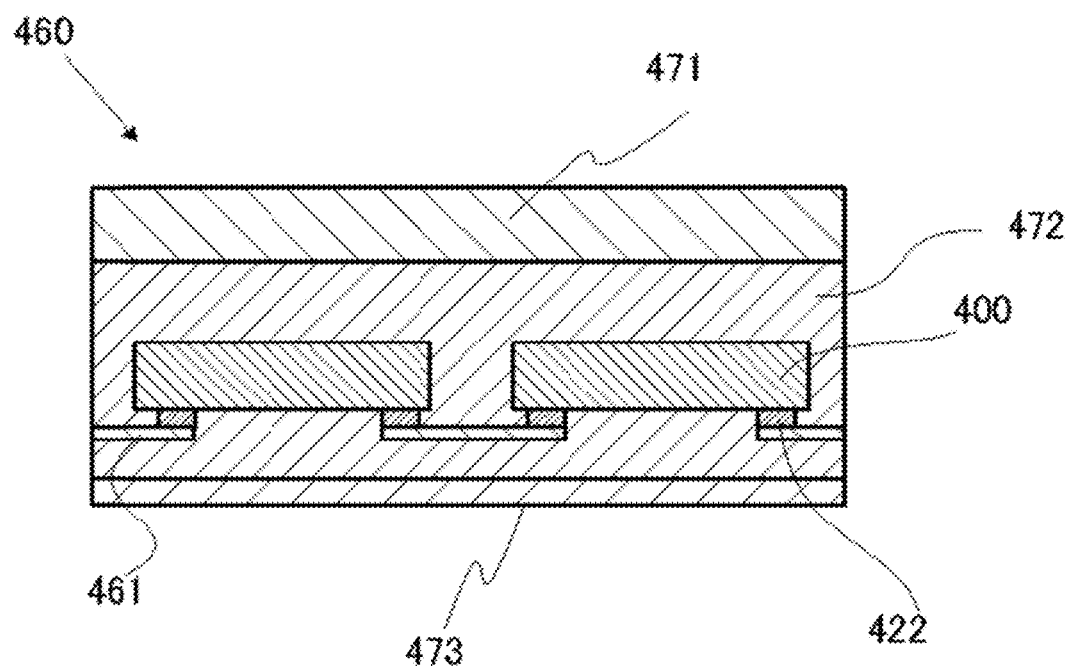
FIG. 10 is a schematic cross-sectional view of the photovoltaic module according to the present invention.

FIG. 10 shows a schematic cross-sectional view of the photovoltaic module 460. As described above, the string is constituted by connecting the plurality of solar cells 400 to the lead wires 461 through bus bar electrodes 422. The string is usually sealed in by using a filler 472 having translucency such as EVA (ethylene vinyl acetate), and a non-light receiving surface side is covered with a weatherable resin film 473 such as PET (polyethylene terephthalate), and a light receiving surface is covered with a light receiving surface protective material 471 having translucency and high mechanical strength such as soda-lime glass. As the filler 472, besides the EVA, polyolefin, silicone, or the like can be used.

Figure 11:
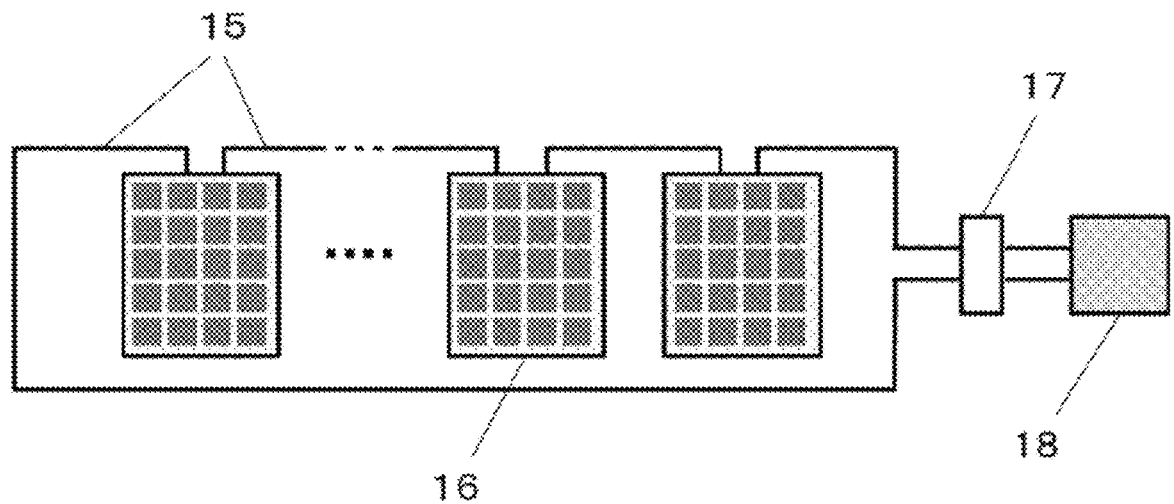
FIG. 11 is a schematic view of a photovoltaic power generation system according to the present invention.

Moreover, a photovoltaic power generation system can be manufactured and configured by using this photovoltaic module. FIG. 11 shows a basic structure of the photovoltaic power generation system having the modules according to the present invention coupled with each other. A plurality of photovoltaic modules 16 are coupled in series through wirings 15, and generated electric power is supplied to an external load circuit 18 through an inverter 17. Although not shown in FIG. 11, the system may further include a secondary cell which stores the generated electric power.

EXAMPLES

The present invention will now be more specifically described hereinafter with reference to exampled and comparative exampled, but the present invention is not restricted thereto.

To confirm effectiveness of the present invention, solar cell characteristics were compared.

Fabrication Procedure and Conditions Common to Examples 1-1 to 1-6, Comparative Examples 1-1 and 1-2, and Example 2

First, as each semiconductor substrate, a phosphorous-doped {100} N-type as-cut silicon substrate having a horizontal and vertical size of 156×156 mm, a thickness of 200 µm, and a specific resistance of 1 Ω·cm was prepared. Then, a damage layer of the silicon substrate was removed by using a heated potassium hydroxide solution. Subsequently, the substrate was immersed into an aqueous solution containing potassium hydroxide and 2-propanol to form a texture on a substrate surface. Then, the substrate was immersed in an aqueous solution of a 1% hydrochloric acid and 1% hydrogen peroxide maintained at 80° C. for five minutes, then rinsed with pure water for five minutes, and thereafter dried in a clean oven.

Subsequently, a P-type diffusion layer was formed on the substrate. The two substrates were overlapped as a pair and put into a heat treatment furnace in this state, a mixed gas of $BBr_3$, oxygen and argon was introduced, and a heat treatment was carried out at 1000° C. for 10 minutes.

Then, an N-type diffusion layer was formed. The two substrates were overlapped as a pair and put into the heat treatment furnace in this state, and a heat treatment was carried out in a mixed gas atmosphere of phosphorous oxychloride, nitrogen, and oxygen at 900° C. for 40 minutes.

Then, glass on the surface was removed by using a 25% hydrofluoric acid, and cleaning was performed in an aqueous solution of the 1% hydrochloric acid and the 1% hydrogen peroxide.

Subsequently, these silicon substrates were treated in an oxygen atmosphere at 900° C. for 40 minutes to be thermally oxidized, and a thermal oxide film of 20 nm was formed on both surfaces of each substrate.

Subsequently, an antireflection film or a passivation film which is a silicon nitride film was formed on the thermal oxide film on each of both the surfaces. At this time, a plasma CVD method was used, and a mixed gas of monosilane and ammonia was used as a reactant gas. A film thickness of a light receiving surface was set to 80 nm, and a refractive index of the same was set to 2.0. A film thickness of a non-light receiving surfaces was set to 80 mm, and a refractive index of the same was set to 2.2.

Then, a silver paste was screen-printed on the entire non-light receiving surface in a comb-tooth-shaped pattern, and dried. Thereafter, the silver paste was screen-printed on the light receiving surface in the comb-tooth-shaped pattern, and dried. The silver paste has silver powder dispersed in an organic solvent. A heat treatment was performed at 840° C. in an air atmosphere for approximately 10 seconds, and silver was sintered. At this sintering step, a temperature was decreased from 840° C. to 450° C. at a temperature drop rate of 50° C./second or more, and it was further lowered to a room temperature (an environmental temperature).

Examples 1-1 to 1-6 and Comparative Examples 1-1 and 1-2

Each substrate was left at rest in a belt furnace and annealed for 20 minutes under respective conditions, e.g., 25° C. (Comparative Example 1-1), 100° C. (Example 1-1), 200° C. (Example 1-2), 250° C. (Example 1-3), 300° C. (Example 1-4), 400° C. (Example 1-5), 450° C. (Example 1-6), and 500° C. (Comparative Example 1-2).

Example 2

The above-described substrates were left at rest in the belt furnace and annealed at 200° C. for 10 seconds, 30 seconds, one minute, 10 minutes, 40 minutes, and 60 minutes.

Example 3

Bus bar electrodes were formed by using a low-temperature curing silver paste separately from finger electrodes. Specifically, fabrication was performed in the same manner as Examples 1-1 to 1-6 and Comparative Examples 1-1 and 1-2 until an antireflection film/passivation film was formed on both front and back surfaces, and then the finger electrodes having a parallel line shape pattern were screen-printed on the front and back surfaces and dried. The substrates were heat-treated in an air atmosphere at 840° C. for approximately 10 seconds, and silver was sintered. At this sintering step, the temperature was decreased from 840° C. to 450° C. at a temperature drop rate of 50° C./second or more, and it was further lowered to a room temperature (an environmental temperature). As the bus bar electrodes, three lines of an epoxy-based silver paste were printed on the front and back surfaces and dried, and the substrates were left at rest in the belt furnace and annealed at 200° C. for one minute, five minutes, 10 minutes, 30 minutes, and 60 minutes.

Example 4

A backside contact solar cell was fabricated by using the present invention. Fabrication was carried out until boron diffusion in the same manner as Example 1, and thermal oxidation was performed at 1000° C. for three hours to form a thermal oxide film on both surfaces. Thermal oxide film was opened in a parallel line shape having intervals of 1.4 mm by using an etching paste, and immersed into a 25% KOH aqueous solution of 70° C. for six minutes to etch a $P^+$ layer in each opening portion. Further, phosphorous-diffused/passivation film was formed by the same method as Example 1. Finger electrodes having a parallel line shape pattern having intervals of 0.7 mm were solely screen-printed on a non-light receiving surface along an N+ region, and then dried. The obtained product was heat-treated in an air atmosphere at 840° C. for approximately 10 seconds to sinter silver. At this sintering step, the temperature was decreased from 840° C. to 450° C. at a temperature drop rate of 50° C./second or more, and it was further lowered to a room temperature (an environmental temperature). An insulating material intended to insulate from the opposed bus bar electrodes was screen-printed at three positions per finger electrode, eventually to all the finger electrodes in a pattern shape, and dried. As the insulating material, silicone manufactured by Shin-Etsu Chemical Co., Ltd. was used. The substrates were left at rest in the belt furnace and annealed for five minutes under respective conditions of, 100, 150, 200, 250, 300, and 350° C. At last, as bus bar electrodes, six lines of the epoxy-based silver paste were printed to be orthogonal to the already provided finger electrodes and dried, and the substrates were left at rest in the belt furnace and annealed at 200° C. for 30 minutes.

(Evaluation Method)

Current-voltage characteristics of the thus obtained samples of the solar cell were measured by using a solar simulator manufactured by Yamashita Denso Corporation under conditions of an AM 1.5 spectrum, irradiation intensity of 100 mW/cm$^2$, and 25° C., and photoelectric conversion efficiency was obtained. Further, the samples were left at a room temperature in an air atmosphere, and measurement was carried out under the same conditions after one week. A characteristic maintenance factor was defined as a value obtained by dividing conversion efficiency after one week by initial efficiency. That is, it conforms to the following computational expression.

Maintenance Factor=(Conversion Efficiency after One Week)/(Initial Conversion Efficiency)

Obtained results are shown in FIG. 4, FIG. 5, FIG. 6, and FIG. 7 where a left axis represents the initial conversion efficiency and a right axis shows the maintenance factor.

Figure 4:
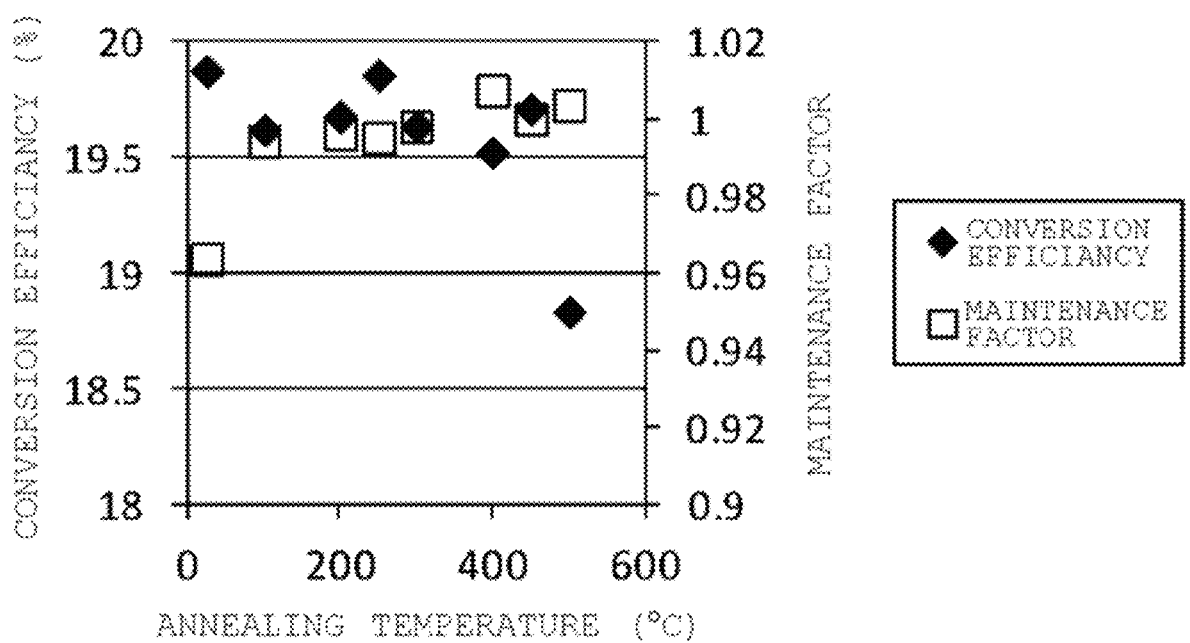
FIG. 4 is a view showing a correlation between an annealing temperature, and conversion efficiency and a conversion efficiency maintenance factor obtained by Examples 1-1 to 1-6 and Comparative Examples 1-1 and 1-2.

FIG. 4 summarizes results of Examples 1-1 to 1-6 and Comparative examples 1-1 and 1-2. A decrease in initial conversion efficiency can be observed at 500° C. It can be considered that, when an annealing temperature is too high, a flaw is produced in an electrode contact. A decrease in maintenance factor can be observed at 25° C. alone. That is because a degradation phenomenon has occurred. To avoid the degradation, the annealing temperature of 100° C. or more is required.

Figure 5:
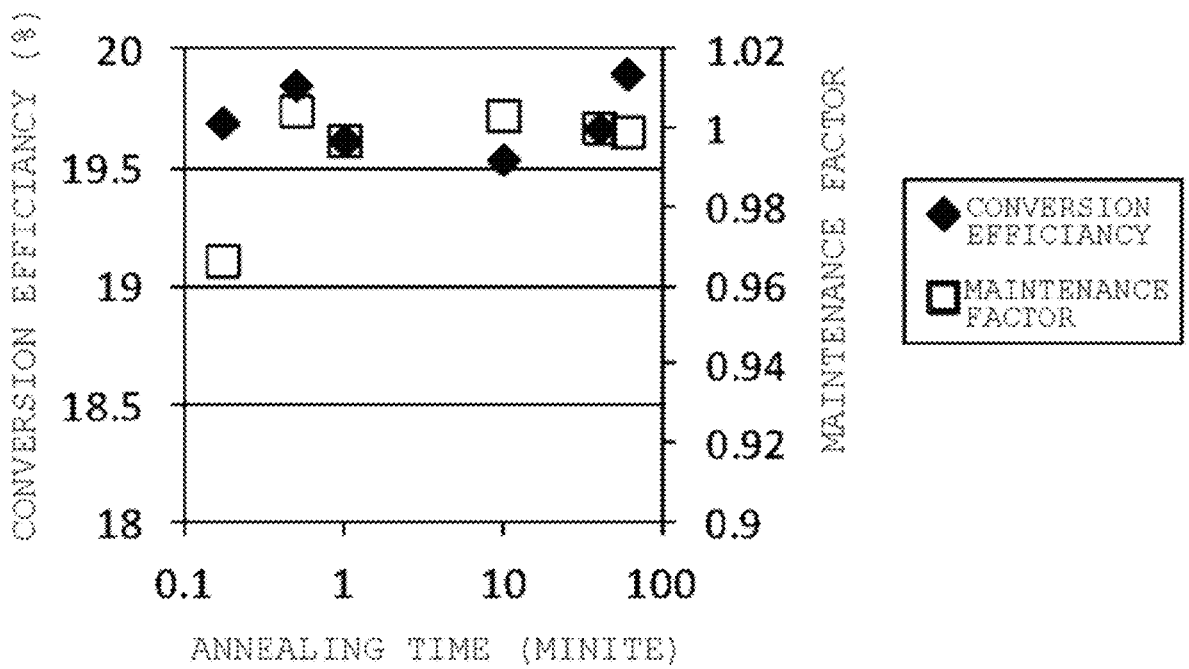
FIG. 5 is a graph showing a correlation between an annealing time, and conversion efficiency and a conversion efficiency maintenance factor obtained by Example 2.

FIG. 5 summarizes results of Example 2. Initial characteristics are the same under any conditions. A slight decrease in maintenance factor can be seen in case of 10 seconds alone. That is because the degradation phenomenon has occurred. To avoid the degradation, an annealing time of 30 seconds or more is preferable.

Figure 6:
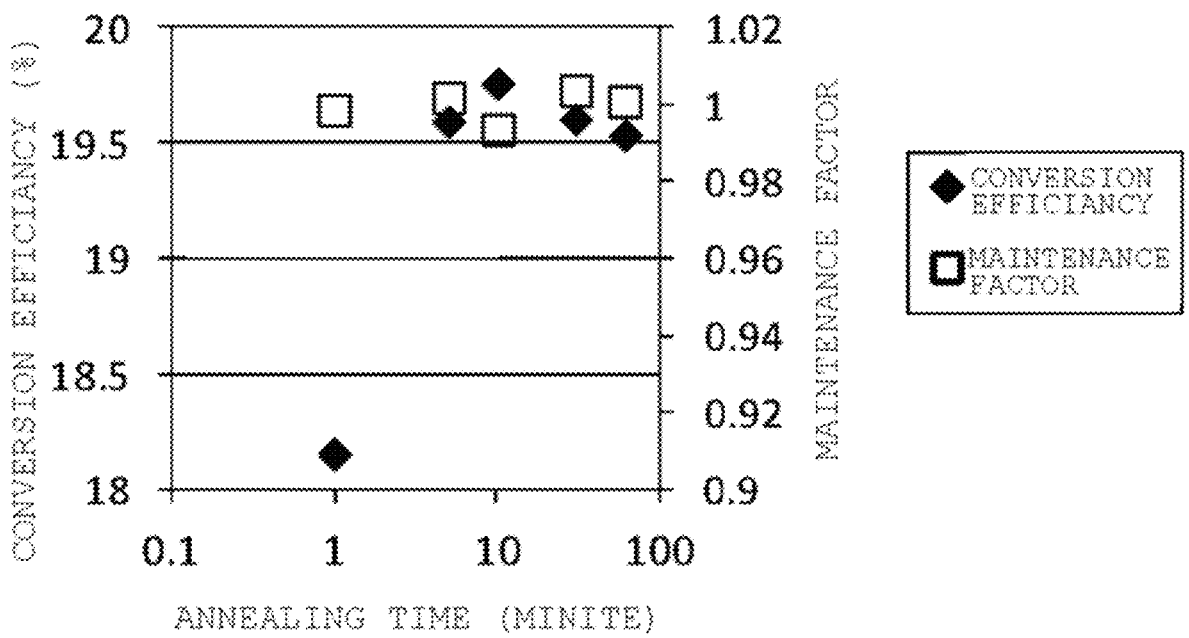
FIG. 6 is a view showing a correlation between a low-temperature curing conductive material annealing time, and conversion efficiency and a conversion efficiency maintenance factor provided by Example 3.

FIG. 6 summarizes results of Example 3. Initial characteristics are low in case of one minute. As a reason for this, insufficient curing of the bus bar electrode material can be considered. The maintenance factor remains the same, and no degradation can be observed. Thus, the effect of preventing the degradation due to the low-temperature annealing treatment according to the present invention can be provided.

Figure 7:
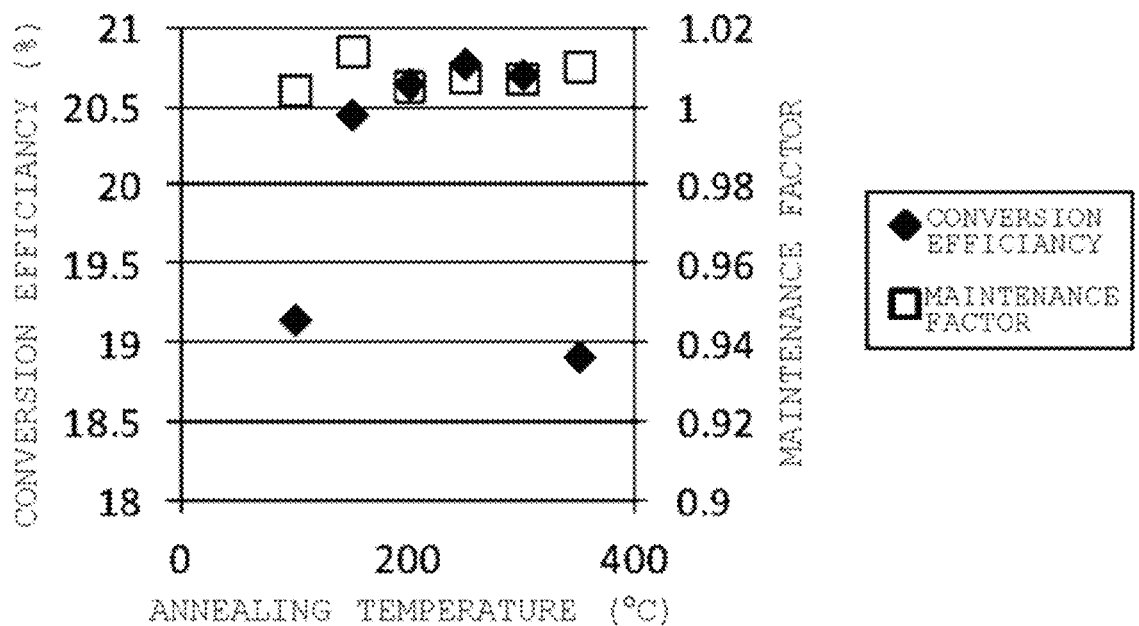
FIG. 7 is a view showing a correlation between an insulating material annealing temperature, and conversion efficiency and a conversion efficiency maintenance factor obtained by Example 4.

FIG. 7 summarizes results of Example 4. Initial characteristics are low at 100° C. and 350° C. In case of 100° C., insufficient curing of the insulating material can be considered as a cause. In case of 350° C., a progression of oxidation (burning) of the insulating material can be considered as a cause. The maintenance factor remains the same, and no degradation is observed. Thus, the effect of preventing the degradation due to the low-temperature annealing treatment according to the present invention can be provided.

It is to be noted that the present invention is not restricted to the foregoing embodiment. The foregoing embodiment is an illustrative example, and any example which has substantially the same structure and exerts the same functions and effects as the technical concept described in claims of the present invention is included in the technical scope of the present invention.

The invention claimed is:

1. A method for manufacturing a solar cell comprising:
preparing a semiconductor silicon substrate, wherein
the semiconductor silicon substrate is prepared such that
the semiconductor silicon substrate has an electrode, the electrode being formed by baking an electrode precursor containing Ag powder on at least one main surface of the semiconductor silicon substrate, and
the semiconductor silicon substrate has a PN junction; and
performing an annealing treatment to the semiconductor silicon substrate at 100° C. or more and 450° C. or less; wherein
in the baking of the electrode precursor, a temperature drop rate from a maximum temperature to 450° C. is set to 50° C./second or more, and
after preparing the semiconductor silicon substrate, a low-temperature curing conductive material, which is curable in a range of 100° C. or more and 450° C. or less, is applied to the main surface of the semiconductor substrate in a pattern shape, and then, at the time of performing the annealing treatment, the low-temperature curing conductive material is cured at the same time to form a conductor section.

2. The method for manufacturing a solar cell according to claim 1, wherein
after preparing the semiconductor silicon substrate, an insulating material, which is curable in a range of 100° C. or more and 450° C. or less, is applied to the main surface of the semiconductor silicon substrate in a pattern shape, and
then, at the time of performing the annealing treatment, the insulating material is cured at the same time to form an insulator film.

3. The method for manufacturing a solar cell according to claim 2, wherein the annealing treatment is performed for a time of 0.5 minute or more.

4. The method for manufacturing a solar cell according to claim 3, wherein the maximum temperature in the baking of the electrode precursor is set to 500° C. or more and 1100° C. or less.

5. The method for manufacturing a solar cell according to claim 3, wherein the semiconductor silicon substrate is an N-type semiconductor silicon substrate.

6. The method for manufacturing a solar cell according to claim 2, wherein the maximum temperature in the baking of the electrode precursor is set to 500° C. or more and 1100° C. or less.

7. The method for manufacturing a solar cell according to claim 2, wherein the semiconductor silicon substrate is an N-type semiconductor silicon substrate.

8. The method for manufacturing a solar cell according to claim 1, wherein the annealing treatment is performed for a time of 0.5 minute or more.

9. The method for manufacturing a solar cell according to claim 8, wherein the maximum temperature in the baking of the electrode precursor is set to 500° C. or more and 1100° C. or less.

10. The method for manufacturing a solar cell according to claim 8, wherein the semiconductor silicon substrate is an N-type semiconductor silicon substrate.

11. The method for manufacturing a solar cell according to claim 1, wherein the maximum temperature in the baking of the electrode precursor is set to 500° C. or more and 1100° C. or less.

12. The method for manufacturing a solar cell according to claim 1, wherein the semiconductor silicon substrate is an N-type semiconductor silicon substrate.

13. A method for manufacturing a solar cell comprising:
preparing a semiconductor silicon substrate, wherein
the semiconductor silicon substrate is prepared such that
the semiconductor silicon substrate has an electrode, the electrode being formed by baking an electrode precursor containing Ag powder on at least one main surface of the semiconductor silicon substrate, and
the semiconductor silicon substrate has a PN junction; and
performing an annealing treatment to the semiconductor silicon substrate at 100° C. or more and 450° C. or less;
wherein
in the baking of the electrode precursor, a temperature drop rate from a maximum temperature to 450° C. is set to 50° C./second or more, and
after preparing the semiconductor silicon substrate, an insulating material, which is curable in a range of 100° C. or more and 450° C. or less, is applied to the main surface of the semiconductor silicon substrate in a pattern shape, and then, at the time of performing the annealing treatment, the insulating material is cured at the same time to form an insulator film.

14. The method for manufacturing a solar cell according to claim 13, wherein the annealing treatment is performed for a time of 0.5 minute or more.

15. The method for manufacturing a solar cell according to claim 14, wherein the maximum temperature in the baking of the electrode precursor is set to 500° C. or more and 1100° C. or less.

16. The method for manufacturing a solar cell according to claim 14, wherein the semiconductor silicon substrate is an N-type semiconductor silicon substrate.

17. The method for manufacturing a solar cell according to claim 13, wherein the maximum temperature in the baking of the electrode precursor is set to 500° C. or more and 1100° C. or less.

18. The method for manufacturing a solar cell according to claim 13, wherein the semiconductor silicon substrate is an N-type semiconductor silicon substrate.

* * * * *